United States Patent [19]

Wright et al.

[11] 4,252,626
[45] Feb. 24, 1981

[54] CATHODE SPUTTERING WITH MULTIPLE TARGETS

[75] Inventors: Robert J. Wright, Tequesta; Ralph J. Hecht, N. Palm Beach, both of Fla.

[73] Assignee: United Technologies Corporation, Hartford, Conn.

[21] Appl. No.: 128,419

[22] Filed: Mar. 10, 1980

[51] Int. Cl.³ .............................................. C23C 15/00
[52] U.S. Cl. .................................. 204/192 R; 204/298
[58] Field of Search ............................. 204/298, 192 R

[56] References Cited

U.S. PATENT DOCUMENTS

| 3,354,074 | 11/1967 | Kay | 204/298 |
|---|---|---|---|
| 3,979,273 | 9/1976 | Panzera et al. | 204/192 |
| 4,090,941 | 5/1978 | Wright et al. | 204/298 |

OTHER PUBLICATIONS

E. D. McClanahan et al., "Initial Work on the Application of Protective Coatings to Marine Gas Turbine Components by High-Rate Sputtering" ASME Publication 74-GT-100 (1974).

W. W. Anderson, "Magnetron Reactive Sputtering Deposition of $Cu_2S/CoS$ Solar Cells", *Proceedings,* 2nd European Community Photovoltaic Solar Energy Conf. (1979) pp. 890–897.

E. L. Hollar et al., "Composite Film Metallizing for Ceramics", *J. Electrochem. Soc.,* vol. 117, No. 11 (Nov. 1970) pp. 1461–1462.

*Primary Examiner*—Howard S. Williams
*Assistant Examiner*—William Leader
*Attorney, Agent, or Firm*—Charles E. Sohl

[57] ABSTRACT

Apparatus and methods for depositing a coating on a substrate are disclosed. Cathode sputtering techniques for rapidly depositing a relatively thick coating, of controllable and variable composition using multiple cathodes on a substrate having a complex geometry are developed. The apparatus employed includes a sputtering chamber formed between a center, post cathode, a hollow cylindrical cathode and supplemental cathode targets of a different composition.

6 Claims, 3 Drawing Figures

CATHODE SPUTTERING WITH MULTIPLE TARGETS

BACKGROUND OF THE INVENTION

1. Field of the Invention

This invention relates to the deposition coating materials on substrate articles, and more particularly to cathode sputtering of high temperature materials using multiple targets to provide a high degree of coating composition control.

2. Description of the Prior Art

Cathode sputtering is a process known in the art for depositing material on the surface of a substrate article. Deposition of the material on the article combines the properties of the coating material with the properties of the substrate material to produce a composite structure with enhanced capabilities.

In the practice of the cathode sputtering process, a coating material on a sacrificial cathode is bombarded by ions moving in response to an electric field causing a transfer of energy to the surface atoms of the coating material. The energized surface atoms eject from the sacrificial cathode into a sputtering chamber where a portion of the ejected atoms is intercepted by the substrate to be coated. The intercepted atoms strike the surface of the substrate and adhere thereto. Repeated depositions on the atomic scale over a period of time produce an even, well adhered coating on the substrate. The deposition of high melting point materials, including even ceramics, has been achieved. Notwithstanding the apparent benefits of cathode sputtering, apparatus and techniques for satisfactorily applying thick, high temperature coatings, of controllable and variable compositions, of material within reasonable elapsed periods have not heretofore been developed.

Designers and manufacturers of gas turbine engines are expending substantial economic and personnel resources in search for new apparatus and procedures capable of rendering cathode sputtering suitable for the rapid deposition of high temperature coatings on parts having complex geometries.

Increasing gas turbine operating temperatures have resulted in the development of more complex coatings. Among the coating ingredients now contemplated are the precious metals of platinum and rhodium. The high cost of such elements makes it important that efficient deposition means and apparatus be developed to precisely control the deposition and composition of such coatings.

U.S. Pat. No. 4,090,941 which shares a common assignee with the present application describes a hollow cathode sputtering apparatus having particular utility in the coating of gas turbine parts. The contents of this issued patent is incorporated herein by reference.

SUMMARY OF THE INVENTION

A primary object of the present invention is to provide methods and apparatus for coating substrate articles having complex geometries. Apparatus for effecting efficient cathode sputtering is sought, and in at least one embodiment, a specific aim is to deposit a relatively thick, high temperature coating, of controlled and variable composition, on a multiplicity of substrates within a single apparatus.

According to the present invention the sputtering chamber of a cathode sputtering device is formed between a center post cathode and a hollow cylindrical cathode. The center post cathode and the hollow cylindrical cathode are simultaneously bombarded with positively charged ions to produce a flux of coating atoms converging from the hollow cathode and a flux of coating atoms diverging from the post cathode.

Supplemental sputtering targets are interposed in the space between the center post cathode and the outer cylindrical cathode. The supplemental targets are of a different composition than hollow and post cathodes. The rate of sputtering from the hollow, post cathode and supplemental target cathodes may be independently controlled.

Primary features of the present invention include the center post cathode and the hollow cylindrical cathode which form the sputtering chamber therebetween. A plurality of supplemental cathode targets of a different composition are provided within the annulus between the hollow and post cathode between the substrates being coated. An electron emitter at one end of the chamber and an anode plate at the opposing end of the chamber cause migration of electrons through the chamber during operation. In one embodiment, the substrate articles are suspended within the sputtering chamber on a rotatable rod. Other features in more detailed embodiments include means for applying an electrical bias to the substrate article and magnetic means for confining the plasma within the sputtering chamber. Different electrical means are provided to control the sputtering rate of the supplemental cathode target material.

A principal advantage of the apparatus of the present invention is the degree of coating composition control which is provided. An excellent coating quality with good reproducibility is obtained. The coating is both dense and well adhered to the substrate. Through the use of supplemental targets of different compositions independent control of the constituents which make up the supplemental sputtering target may be obtained. Further, the amount of the supplemental target material which is deposited on the coated article may be varied as a function of coating thickness.

The foregoing, and other objects, features and advantages of the present invention will become more apparent in light of the following detailed description of the preferred embodiment thereof as shown in the accompanying drawings.

DESCRIPTION OF THE PREFERRED EMBODIMENTS

Figure 1:
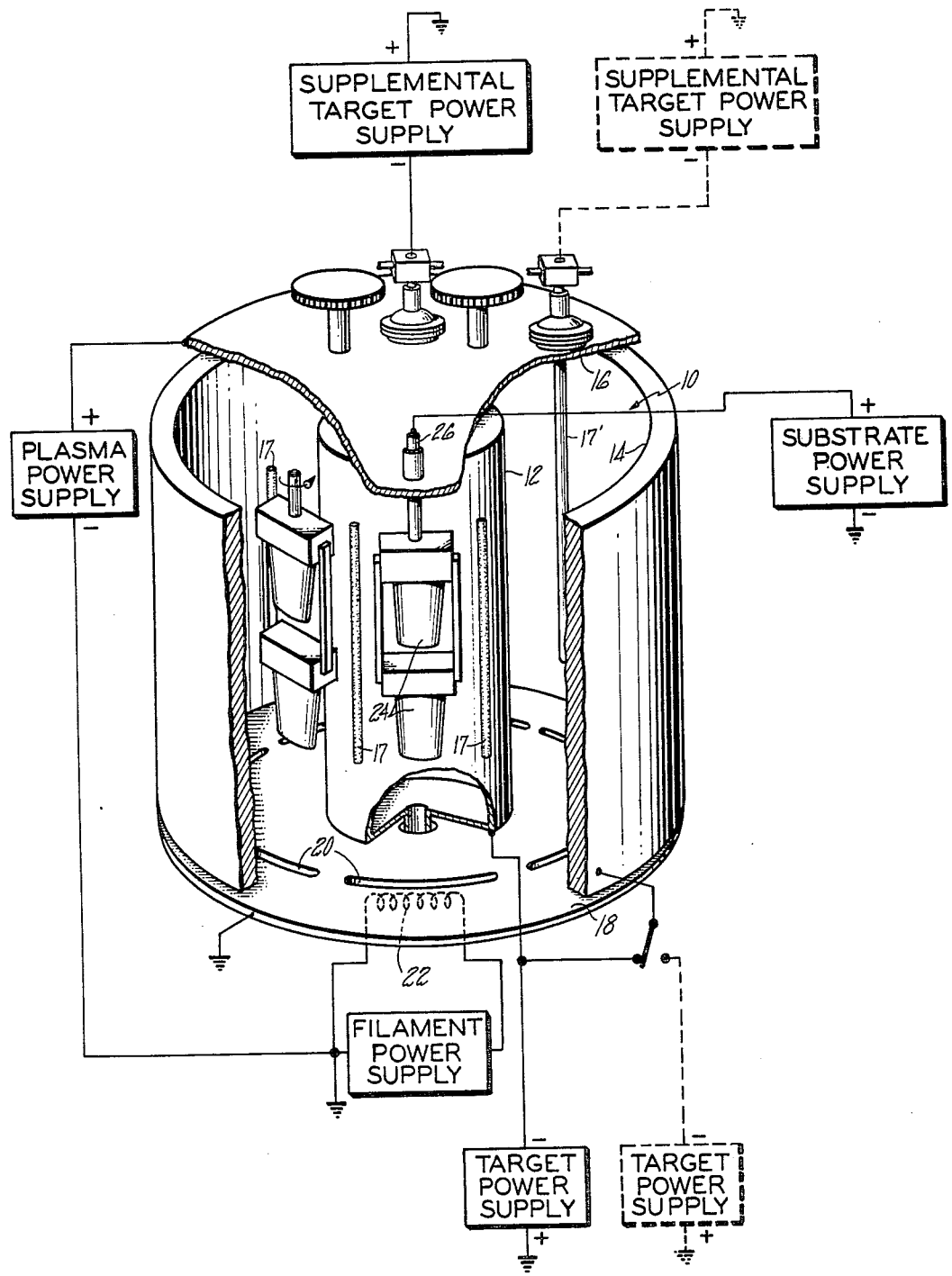
FIG. 1 is a simplified perspective view of the apparatus of the present invention illustrating the principal components forming the sputtering chamber.

The concepts of the present invention are illustrated in FIG. 1 which is a simplified perspective view. An annular sputtering chamber 10 is formed between a center post cathode 12 and a hollow cylindrical cathode 14. Supplemental cathode targets 17 are provided within the sputtering chamber 10. An anode plate 16 is disposed at one end of the chamber 10 and a ground plate 18 having a plurality of apertures 20 is disposed at the opposing end of the chamber. An electron source such as a filament 22 of the type adapted for the thermionic emission of electrons is disposed behind the ground plate. Substrate articles 24 are suspended within the sputtering chamber 10 on a support member 26 which penetrates the anode plate 16. The supplemental cathode targets, which penetrate but are electrically isolated from the anode plate 16, are spaced between the substate articles 24. The substrate articles are electrically insulated from the anode plate and the cathodes.

During operation of the apparatus the sputtering chamber is filled with an inert gas such as argon at a reduced pressure. While argon will be referred to in the following discussion, other gases may also be used and fall within the scope of this invention. Various power supplies which will be discussed later are used to supply the energy necessary for the sputtering process. Electrons emitted by the filament 22 are drawn into the sputtering chamber 10 by the anode plate 16 through the apertures 20 in the ground plate 18. A portion of the emitted electrons strike atoms of the argon gas within the chamber and cause the emission of one or more electrons from the impacted argon atoms forming positive argon ions. The positively charged ions are attracted to the post cathode 12, the cylindrical cathode 14 and the supplemental target cathodes 17 where the ions impart kinetic energy to the surface atoms of the cathode material. Energized cathode atoms sputter from the surface of the hollow, post and supplemental cathodes into the chamber 10. The relative flux concentrations of the various sputtered cathode materials may be controlled by controlling the electrical parameters of the system. A portion of the sputtered atoms impinge upon and adhere to the substrate article to be coated. The repeated incidence of cathode atoms on the surface of the substrate forms the desired coating thereon. The thickness of the coating is a function of the exposure period within the chamber and of the intensity of the coating atom flux. Typical coating depths of approximately five (5) mils are obtainable in an eight (8) hour coating cycle. Additional concepts discussed subsequently in this specification reveal techniques for accelerating the rate of deposition.

FIG. 1 also shows, in schematic form, the electrical circuitry employed with the apparatus of the invention. In the following discussion, the voltage and current values provided are approximate and will vary depending upon the material being sputtered and the size of the apparatus.

A filament power supply is provided to heat the filament 22 to a temperature where substantial emission of electrons occurs. Preferably, a filament of thoriated tungsten or like material adapted for enhanced electron emission is employed. The filament power supply parameters will vary according to the particular filament employed.

The plasma power supply is a low voltage high current source (approximately 30–50 VDC at 300 amperes) which provides the energy to ionize the gas which fills the chamber.

The target power supplies provide the electric field which caused the gas ions to strike the sputtering targets. The impact of the gas ions on the target causes the sputtering of the target material. These power supplies are high voltage high current sources. Typical values for the target power supplies are 0–1.5 KV at 0–25 m.a. per square centimeter of target area. Either D.C., A.C. or RF supplies may be used. Usually the post and hollow cylinder targets are electrically connected together so that only one target power supply is used. By having the post and cylinder targets of different compositions and by using independent power supplies a further degree of coating composition control is available.

A similar power supply is used in conjunction with the supplemental targets. Two supplemental target power supplies are shown in FIG. 1 reflecting the possibility that more than one composition of supplemental target might be employed. By having independently variable power supplies, the amount of each supplemental target material deposited in the coating may be varied during the coating cycle. This permits the production of a sputtered coating whose composition varies in a predetermined fashion through its thickness.

The substrate power supply can be used to draw the sputtered atoms to the substrate. The substrate power supply also permits a degree of substrate temperature control (by causing a fraction of the electrons emitted from the filament to strike the substrate). The substrate is positively biased during sputtering. By applying a negative bias to the substrate sputtering from the substrate surface may be used as a cleaning technique prior to sputtering from the cathode onto the substrate. The substrate power supply parameters are approximately ±200 VDC at 10 amps.

Figure 2:
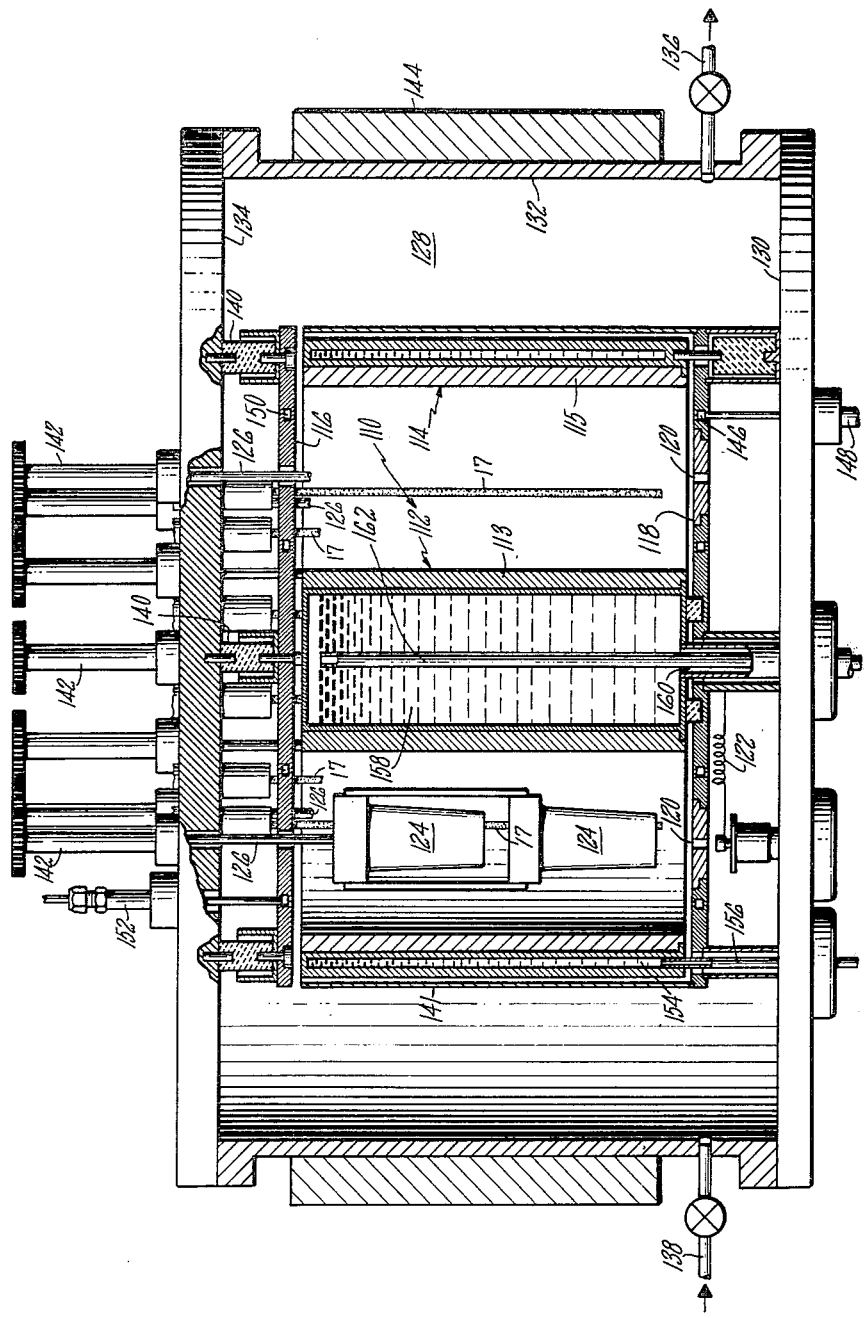
FIG. 2 is a more detailed cross section view of cathode sputtering apparatus embodying the concepts of the present invention.

The apparatus of the present invention is illustrated in expanded detail in FIG. 2. An annular sputtering chamber 110 is formed between a center, post cathode 112 and hollow cylindrical cathode 114. The center, post cathode 112, is formed of a can-like structure encased by a thick layer of a first sputtering material. The hollow cylindrical cathode is formed of a cylindrical structure having a thick layer of a first sputtering material on the inner surface thereof. An anode plate 116 is disposed at one end of the chamber 110 and a ground plate 118 having a plurality of apertures 120 is disposed at the opposing end of the chamber.

Supplemental targets 17 are provided, for coating composition control, and are located in the chamber 110 between the substrate articles 124. The details of the supplemental target assembly will be discussed below with reference to FIG. 3.

A filament 122 of the type adapted for the thermionic emission of electrons is disposed beneath the ground plate. Substrate articles 124 are suspended within the sputtering chamber 110 on a rod-like member 126 which penetrates the anode plate 116. Alternatively, the filaments 122 may extend into the sputtering chamber.

The sputtering chamber 110 is encased within a vacuum chamber 128. The vacuum chamber is formed of a base plate 130, a cylindrical wall 132 and a detachable top plate 134. Discharge means 136 is adapted to evacuate the chamber and supply means 138 is adapted to flow working medium gases into the chamber. The anode plate 116 is suspended from a top plate 134 by a plurality of anode insulators 140. The insulators are fabricated of a ceramic material and electrically isolate the anode plate from the supporting top plate. The post cathode 112 and the hollow cylindrical cathode 114 extend upwardly from the base plate 130 into the vacuum chamber 128 to form the sputtering chamber 110. Both the post cathode and the cylindrical cathode are electrically isolated from the base plate. As will be discussed below, the supplemental target cathodes 117 also extend through the top plate and the anode plate. A cylindrical ground shield 141 encases the hollow cathode to contain the plasma within the sputtering chamber. The substrate articles 124 are supported in the sputtering chamber on rod-like members 126 which extend through the top plate 134 and through the anode plate 116. The rods are rotatable within supports 142 in order to enable rotation of the substrate articles within the sputtering chamber.

Additionally, although not specifically illustrated, the substrate articles may be caused to revolve about the center, post cathode. An electrical coil 144 may be disposed about the outer periphery of the vacuum chamber wall 132. The energized electrical coil is adapted to impose a magnetic field within the sputtering chamber for further control of the plasma.

Figure 3:
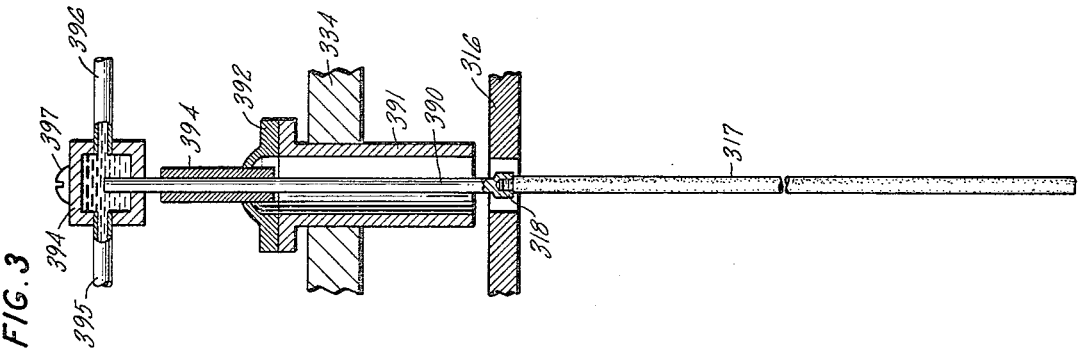
FIG. 3 shows in detail the feed through apparatus used to deliver power to the supplemental sputtering target.

The major components of the apparatus which are in close proximity to the sputtering chamber 110 are cooled. The ground plate 118 has a plurality of passages 146 through which a cooling medium is flowable via the supply means 148. Similarly, the anode plate 116 has a plurality of passages 150 through which a cooling medium is flowable via the supply means 152. The hollow cylindrical cathode 114 has passages 154 through which a cooling medium is flowable via the supply means 156. The post cathode 112 has a cooling reservoir 158 including supply means 160 and discharge means 162. As shown in FIG. 3, the upper portion of the supplemental target assemblies are also water cooled.

FIG. 3 shows the support mechanism for the supplemental target cathode. The supplemental target cathode 317 extends through the anode plate 316. The supplemental target cathode arrangement passes through an aperture in the anode and is electrically isolated therefrom.

A coupling arrangement 318 is provided so that the supplemental target cathode 317 may be readily replaced without disturbing the feed through mechanism. This coupling 318 provides both mechanical support and electric continuity. We have used a threaded coupling with good results, but there are numerous other possibilities. This coupling arrangement is, in fact, optional and may be omitted in certain situations.

The coupling arrangement 318 connects the supplemental target 317 with the support member 390 which passes through but is electrically isolated from a shield 391 which serves to prevent sputtering from the target support rod. The shield 391 is metal and is hermetically bonded to the upper chamber cover 334.

Located above the shield portion exterior of the upper cover plate 334 are sealing members 392 and 394. At least one of the members is made of a non-conductive material so that the supplemental target is insulated from the cover plate 334. These sealing members are hermetically joined to the shield and to each other and reserve the vacuum integrity of the system. The upper end of the support rod 390 passes into and is joined into a water jacket assembly 394.

The water cools the upper portion of the assembly and prevents possible damage to the supplemental target support mechanism from heat generated by the sputtering process.

The water jacket assembly is optional and may not be required in all circumstances especially where a low rate of sputtering from the supplemental target is anticipated.

Water flows into the water chamber from a source (not shown) and enters through tube 395 and exists through tube 396.

Finally, located on top of the water jacket 394 is a suitable electrical terminal 397 which provides electrical contact to the supplemental target assembly.

In a typical coating process employing the above described apparatus, the articles to be coated are fixtured on the rotatable rods 126. The fixtured articles are lowered into the sputtering chamber and the chamber is evacuated. The chamber is then back filled with an inert gas such as argon. Argon may be continually flowed through the chamber, but a partial vacuum remains in the chamber. The filament 122 is next energized to emit electrons. The substrate is first biased positively to heat the substrate by electron bombardment to a preferred temperature, and then biased negatively to sputter clean the surface through argon ion bombardment. The sputter cleaned surface is ready for deposition of the coating material.

To deposit coating material the cathode is biased negatively and the anode is biased positively. Electrons migrating toward the positively charged anode strike argon atoms and cause the emission of electrons therefrom. Positive argon ions are formed. The positive argon ions are drawn to the negatively charged cathodes. Impact of the ions on the surface of the cathode material causes sputtering of the cathode material into the chamber 110. The sputtered material impinges upon the substrate article and the coating develops. The substrate articles are rotated within the chamber to uniformly coat the substrate. Upon reaching the desired coating thickness, sputtering is terminated and the argon flow is stopped. The system is evacuated and allowed to cool. The coated parts are then removed.

A major feature of the present invention is the degree of control of final coating composition which is afforded by the supplemental targets. Sputtering of the supplemental target occurs as a result of the electric potential applied by the supplemental target power supply. In the absence of applied energy no sputtering will occur. By controlling this applied energy the amount of material sputtering from the supplemental target may be varied independently of the amount sputtered from the main targets. This affords the possibility of close coating composition control and even the possibility of controlling coating composition through its thickness.

By way of example, the MCrAlY coatings are of great interest in the field of turbine engines and are described in U.S. Pat. Nos. 3,542,530; 3,676,085; 3,754,903 and 3,928,026. Various additions have been proposed to enhance these coatings and one of the most promising additions are the noble metals such as Pt. By using the present invention apparatus and providing Pt supplemental targets in combination with MCrAlY main targets, a controlled coating may be produced having a precise Pt level or a variable Pt level throughout the coating. In this way the costly Pt may be precisely placed in the coating where it will provide the maximum benefit.

Other variations include the possibility of more than one composition of supplemental target in combination with more than one power supply. This would permit the production of coatings with two variable elements.

In a similar fashion, any of the previously described alternatives may be used with dual main targets of different composition; i.e., using CoCrAlY post and a NiCrAlY hollow cylindrical cathode, along with multiple power supplies, a coating of variable NiCoCrAlY composition could be developed.

The apparatus described is useful in applying both high temperature metallic and ceramic coatings. One family of metallic coatings used widely within the aircraft industry for coating turbine blades and vanes are the previously described MCrAlY coatings.

Ceramic coatings of known utility include yttria ($Y_2O_3$), stabilized zirconia ($ZrO_2$), alumina ($Al_2O_3$), silicon carbide (SiC) and silicon nitride ($Si_3N_4$). Those skilled in the art will recognize that the above coatings are merely examples of useful coatings and do not comprise a comprehensive list of all sputterable coatings.

As is viewable in FIG. 2, an electric coil 144 is diposed about the outer wall 132 of the vacuum chamber. The coil when energized establishes a magnetic field within the chamber which shapes the argon ion plasma bombarding the cathode. The coating material is concentrated in a preferred region and locally increased coating depths result.

Although the invention has been shown and described with respect to the preferred embodiments thereof, it should be understood by those skilled in the art that various changes and omissions in the form and detail thereof may be made therein without departing from the spirit and the scope of the invention.

Having thus described typical embodiments of our invention, that which we claim as new and desired to secure by Letters Patent of the United States is:

1. In a sputtering apparatus, for coating substrate articles, of the type which includes;
   a. a hollow cylindrical cathode having an inner surface made of coating material;
   b. a post cathode within the hollow cathode, with the post cathode having an outer surface made of coating material said hollow and post cathodes cooperating to form an annular sputtering chamber, said annular chamber containing a gas at a controlled low pressure;
   c. means for supporting the substrate article to be coated within the annular sputtering chamber;
   d. electron emitting means for introducing electrons into the annular sputtering chamber;
   e. anode means;
   f. means surrounding the hollow cylindrical cathode for maintaining the apparatus at a controlled low gas pressure;
   g. a first variable electric power supply means connected across the electron emitting means to heat said emitting means to a temperature where substantial emission of electrons occurs;
   h. a second variable electric power supply means connected between the anode and ground to cause a flow of electrons from the electron emitting means through the sputtering chamber so as to cause ionization of the gas therein and to form gas ions;
   i. a third variable electric power supply means between the hollow and post cathodes and ground for causing the gas ions to impact the hollow and post cathode coating material to cause sputtering thereof;
   j. a fourth variable electric power supply means connected between the substrate article and ground to attract the sputtered target coating material thereto.
   k. the improvement which comprises; at least one supplemental target cathode having an outer surface made of a coating material, located within the annular sputtering chamber;
   l. a fifth variable electric power supply means connected between said at least one supplemental target cathode and ground for causing the gas ions to impact the supplemental target coating material to cause sputtering thereof.

2. A sputtering apparatus as in claim 1 wherein there are at least two supplemental target cathodes, each having an outer surface of a coating composition differing from that of at least one other supplemental target cathode and wherein said fifth variable electric power supply means comprises at least two independent power supply means such that each cathode with a different composition is provided with an independent power supply.

3. A sputtering apparatus as in claim 1 or 2 wherein said third variable electric power supply means comprises two independent power supply means, one connected to the post cathode and one connected to the hollow cathode.

4. An apparatus as in claim 1 or 2 which includes means for developing a magnetic field within the sputtering chamber.

5. An apparatus as in claim 3 which includes means for developing a magnetic field within the sputtering chamber.

6. A method for applying a complex sputtered coating on a substrate article including the steps of:
   providing an apparatus which includes
   a. a hollow cylindrical cathode having an inner surface made of coating material;
   b. a post cathode within the hollow cathode, with the post cathode having an outer surface made of coating material said hollow and post cathodes cooperating to form an annular sputtering chamber, said annular chamber containing a gas at a controlled low pressure;
   c. means for supporting the substrate article to be coated within the annular sputtering chamber;
   d. electron emitting means for introducing electrons into the annular sputtering chamber;
   e. anode means;
   f. means surrounding the hollow cylindrical cathode for maintaining the apparatus at a controlled low gas pressure;
   g. a first variable electric power supply means connected across the electron emitting means to heat said emitting means to a temperature where substantial emission of electrons occurs;
   h. A second variable electric power supply means connected between the anode and ground to cause a flow of electrons from the electron emitting means through the sputtering chamber so as to cause ionization of the gas therein and to form gas ions;
   i. a third variable electric power supply means between the hollow and post cathodes and ground for causing the gas ions to impact the hollow and post cathode coating material to cause sputtering thereof;
   j. a fourth variable electric power supply means connected between the substrate article and ground to attract the sputtered target coating material thereto;
   k. at least one supplemental target cathode, made of a coating material, located within the annular sputtering chamber;
   l. a fifth variable electric power supply means connected between said at least one supplemental target cathode and ground for causing the gas ions to impact the supplemental target coating material to cause sputtering thereof;

operating the apparatus, including the five power supply means, under conditions which cause the deposition of a sputtered coating of a particular composition on the substrate, and changing the relative outputs of at least one of the five power supply means so as to change the composition of the sputter deposited coating.

* * * * *